United States Patent [19]
De Poortere et al.

[11] 4,134,811
[45] Jan. 16, 1979

[54] HALOGENATED PHOTOPOLYMERIZABLE COMPOSITIONS

[75] Inventors: Michel De Poortere, Brussels; Marc Colpaert, Ghent; Paul Dufour, Ruisbroek; August Vrancken, Dworp, all of Belgium

[73] Assignee: UCB, Societe Anonyme, Belgium

[21] Appl. No.: 682,630

[22] Filed: May 3, 1976

[30] Foreign Application Priority Data

May 12, 1975 [GB] United Kingdom ............... 19786/75

[51] Int. Cl.$^2$ ............................. C08F 2/50; C08F 4/00
[52] U.S. Cl. ................................ 204/159.15; 156/332; 204/159.18; 204/159.19; 260/859 R; 260/860; 260/869; 260/872; 260/884; 260/885; 428/482; 428/423
[58] Field of Search ...................... 204/159.15, 159.18; 106/20, 21, 22; 260/869

[56] References Cited

U.S. PATENT DOCUMENTS

| | | | |
|---|---|---|---|
| 3,389,192 | 6/1968 | Ziegler | 260/862 |
| 3,507,933 | 4/1970 | Larsen et al. | 260/869 |
| 3,536,782 | 10/1970 | Toggweiler et al. | 260/869 |
| 3,577,480 | 5/1971 | Thorpe | 260/869 |
| 3,677,920 | 7/1972 | Kai et al. | 204/159.15 |
| 3,699,022 | 10/1972 | Behrens et al. | 204/159.15 |
| 3,754,054 | 8/1973 | Kimura et al. | 260/860 |
| 3,759,807 | 9/1973 | Osborn et al. | 204/159.23 |
| 3,794,494 | 2/1974 | Kai et al. | 204/159.15 X |
| 3,839,171 | 10/1974 | Akamatsu et al. | 204/159.15 |
| 3,847,771 | 11/1974 | McGinniss | 204/159.24 |
| 3,992,276 | 11/1976 | Powander et al. | 204/159.16 |

*Primary Examiner*—Walter C. Danison
*Attorney, Agent, or Firm*—Wenderoth, Lind & Ponack

[57] ABSTRACT

A film-forming halogenated photopolymerizable composition, which comprises: a) 20 to 70% by weight of at least one halogenated polymer, which (1) has a chain interrupted by at least one oxygen or nitrogen atom, (2) contains from 4 to 70% by weight halogen atoms attached to carbon atoms having the electronic configuration sp$^2$, (called active halogen atoms), (3) has an average molecular weight between 700 and 10,000, (4) has a glass transition temperature (Tg) between 20° C and the thermal decomposition point of the polymer; b) 20 to 60% by weight of at least one monomeric organic compound containing at least two acrylic acid and/or methacrylic acid radicals and containing from 0 to 65% by weight of active halogen atoms; c) 0 to about 40% by weight of at least one monomeric organic compound containing an acrylic acid or methacrylic acid radical and containing from 0 to about 65% by weight active halogen atoms; d) about 1 to about 25% by weight of a photoinitiator system comprising 1) 0.5 to 100% by weight of at least one aromatic ketone, 2) 0 to 99.5% by weight of at least one tertiary amine, at least one carbon atom of which, in the alpha position with regard to the nitrogen atom, carries at least one hydrogen atom; 3) 0 to 90% by weight of an aromatic or non-aromatic alpha-dione, the sum of 1) + 2) + 3) representing 100% by weight of the photoinitiator system; and the total content of active halogen atoms representing about 3 to about 50% by weight of the total halogenated photopolymerizable composition and printing inks, paints and varnishes based on said halogenated photopolymerizable composition, particularly suitable, inter alia, for the manufacture of printed circuits.

24 Claims, No Drawings

HALOGENATED PHOTOPOLYMERIZABLE COMPOSITIONS

The present invention relates to halogenated photopolymerizable compositions containing radicals of acrylic acid and/or methacrylic acid.

The compositions according to the present invention can be used for the manufacture of coatings, such as inks, sealers, base coats, paints and varnishes, which dry extremely rapidly at ambient temperature as a result of the effect of visible or ultra-violet radiation, have an excellent adhesion, even on a smooth and non-porous substrate, such as metal, glass, plastic, paper impregnated with resins or the like, can be applied continuously or discontinuously and do not pollute the environment.

Various systems of printing, decoration and protection have been studied and developed in which use is made, as binders for printing inks, of chemical compositions containing radicals of acrylic acid, methacrylic acid or other olefinically-unsaturated acids and which, for this reason, are capable of polymerizing very rapidly in the presence of a source of ultra-violet light (cf. U.S. Pat. No. 2,453,769). In this way, the problem of offsetting is avoided when stacking printed sheets of paper or metal; furthermore, the use of volatile solvents is no longer necessary. Inks of this kind are described, for example, in Belgian Patent Specifications Nos. 804,639 and 819,308 and in U.S. Pat. Nos. 3,673,140 and 3,952,032.

It is an object of the present invention to provide a composition suitable for printing on metal surfaces. It has been found that photo-polymerizable inks and varnishes can be used, provided that a monochrome paint base coat is first applied to the metal surface. If, on the other hand, the photopolymerizable inks are applied directly to the metal surface, it is found that the adhesion to the metal does not permit an immediate printing of a second layer of ink without the risk of the first film of ink being detached due to the joint effects of the pressure of the rollers and the adhesivity of the second layer of wet ink. According to Z. W. Wicks Jr., (cf. Society of Manufacturing Engineers Technical Paper, reference FC74-501, page 7), this is due to an extremely rapid shrinkage which does not allow relaxation of the internal tensions of the ink film caused by the polymerization. This results in a reduction of the apparent adhesion.

According to French Patent Specification No. 2,179,894, it is possible to overcome this drawback by drying in two stages, i.e. first exposure to ultra-violet rays and then heating the irradiated coating. If this procedure is not used, the adhesion of the ink to the metal surface is unacceptable for most industrial uses. It is possible to avoid heating the ink and yet obtain good adhesion thereof to a substrate, provided that relaxation of the internal stresses can take place during a period ranging from a few minutes to 24 hours at ambient temperature. However, under such conditions, it is not possible to consider a printing of metal plates using a continuous method in which the following layer would have to be printed after a period which ranges from a fraction of a second to a few seconds.

On the other hand, as regards the present inks of the photopolymerizable type which give a sufficient adhesion within a period of a few minutes up to 24 hours at ambient temperature, in most cases an over-dosage of ultra-violet irradiation leads to a decrease in the adhesion. Consequently, if one or more additional layers of photopolymerizable ink are applied successively on top of the first layer which has already been applied on to the metal surface, this first layer undergoes too marked a cross-linkage because the ultra-violet radiation used for drying the additional layers penetrates as far as the first layer, which is in contact with the metal; this results in a loss of adhesion of the said first layer to the metal substrate. To this must be added that, during storage of printed metal sheets, polymerization may continue beyond the optimum value of adhesion, which leads to a similar defect.

The same problem arises not only for inks but also for all the photopolymerizable coatings applied to smooth and non-porous substrates. The difficulties in obtaining a good adhesion vary with the nature of the substrate. It is well-known that electrolytic tinplate covered with a fine coating of dioctyl sebacate or fatty oil presents great problems. It is also generally admitted that adhesion decreases with an increase in the thickness of the coating.

Consequently, one of the objects of the present invention is to provide photopolymerizable compositions which can be used as coatings, particularly as varnishes or inks of the type described above, which retain all the advantages of the known photopolymerizable varnishes and inks as regards reactivity, storage stability, non-pollution, non-offsetting, excellent processing on printing machines, quality of the prints obtained and the like and possess an immediate adhesion of the ink film on a smooth and non-porous surface (for example, metal, plastics, glass, paper impregnated with resin and the like), without it being necessary to carry out a thermal treatment to accelerate relaxation between each application, this immediate cold adhesion making it possible, therefore, to use inks according to the invention not only in discontinuous printing processes but, more particularly, in continuous processes.

"Immediate" adhesion is to be understood to mean an adhesion which is sufficient to permit the printing of a second layer and then subsequent layers in less than a second, without causing the tearing away of the first layer of ink adhering to the metal surface.

Another object of the invention is to provide a composition suitable for printing with silk-screen printing inks and varnishes. In this case, the necessary degree of adhesion not only depends on the substrate but also on the subsequent treatment which the latter undergoes.

Thus, for the manufacturing of printed circuits for the electronic industry, which is one of the silk-screen printing applications of the inks and varnishes according to the invention, there can be proceeded as follows:

(1) a conducting copper foil is bound to a paper substrate which is impregnated with a resin;
(2) a photosensitive composition is applied by lamination or solvent evaporation;
(3) the plate is exposed to a light source passing through a negative representing the printed circuit to be manufactured;
(4) the parts which have not been exposed are eliminated by rinsing;
(5) the copper is etched with a solution containing for example ferric chloride;
(6) the exposed photosensitive composition is rinsed;
(7) a varnish is applied by silk-screen printing in order to protect the bare parts of the paper impregnated with resin and the parts of the printed circuit which are not to be subsequently tinned;

(8) optionally, the application of a white paint on the back side of the plate;

(9) perforation of the plate to let conductors pass through;

(10) marking of symbols, signs and texts on both sides of the circuit by means of one or more silk-screen printing inks;

(11) placing electronic components;

(12) tinning by contact with a molten tin wave.

The above mentioned steps 1 to 12 of the manufacture of printed circuits are those wherein appropriate inks and varnishes interfere. Other stages wherein the nature of the varnish and its qualities have no incidence on the circuits thus produced have been left out on purpose.

The various known varnishes and inks have several drawbacks: in order to allow a high speed of production, they have to be hardened by passing in an oven. However, many circuits do not resist to such a treatment. The paper impregnated with a resin wraps, the copper foil delaminates and so forth. Moreover, the process of photographic preparation of the circuit is slow and tedious.

Various solutions have been proposed to resolve these problems. The photographic technique described in steps 2 to 4 may be replaced by applying on the copper a silk-screen printing varnish reproducing the image of the circuit to be manufactured. The unprotected parts of the copper are etched and the varnish is then removed by means of an organic solvent or an aqueous alkaline solution.

The Belgian Patent Specification No. 829,438 describes photopolymerizable silk-screen printing compositions intended for the production of etch resists suitable for the manufacture of printed circuits. These compositions mainly consist of a polyester binder and a hydroxyalkyl acrylate. These acrylates however are toxic and besides are soluble in water, which even increases the probability of contamination hazards. Moreover, their reactivity towards light is relatively slow. The Examples of this Patent Specification show indeed that the average drying time is 5 seconds (see Example 1 and following). On the contrary, the compositions according to the present invention dry within less than a second, due to the presence of a halogenated component (a) (see Example 23). The reduced energy requirement on one hand and the increase in speed of production of the printed circuits on the other hand obtained by the use of a composition according to the invention thus constitutes important economic advantages. It is to be noted that the description of aforesaid Belgian Patent Specification No. 829,438 mentions among the acids that may be used in the preparation of the polyester binder, the tetrachlorophthalic acid and the halogenated derivatives of polycarboxylic acids such as fumaric, aconitic, mesaconic, citraconic and itaconic acids. However, the fact that none of the examples mentions any of these halogenated acids shows that the inventors did not suspect the possible incidence of such halogenated acids with active chlorine atoms on the speed of polymerization of silk-screen printing compositions, a discovery which forms the main feature of the compositions of the present invention.

On the other hand, the German Offenlegungsschrift No. 2,411,398 discloses compositions suitable for carrying out step 7 described above by the technique of ultraviolet irradiation. These compositions are based on the photochemically initiated reaction of a polyene with a polythiol, making use of a photoinitiator. Even if the photochemical reactivity of these compositions were very high, they have the drawback of requiring very expensive starting materials, among which the polythiols used moreover keep the nauseous smell of mercaptans, in spite of their high molecular weight. On the contrary, the halogenated photopolymerizable compositions of the invention are odorless, non polluting and comparatively inexpensive. Besides they give silk-screen printing varnishes with a high speed of drying, an excellent adhesion to copper and to paper impregnated with resin and a good resistance to molten tin. Consequently, they are of better quality than all existing systems. Moreover, if opacifying agents and/or colored pigments are added to the compositions of the invention, silk-screen printing inks are obtained which are suitable for the decoration step 10 described above and which have all the advantages of the aforesaid silk-screen printing varnishes according to the invention.

Other objects of the present invention will appear to the reader of the present specification.

Thus the present invention provides a film-forming halogenated photopolymerizable composition, which comprises:

(a) 20 to 70% by weight of at least one haloenated polymer, which:
   (1) has a chain interrupted by at least one oxygen or nitrogen atom, (2) contains from 4 to 70% by weight of halogen atoms attached to carbon atoms having the electronic configuration $sp^2$, (3) has an average molecular weight of between about 700 and about 10,000, (4) has a glass transition temperature (Tg) between about 20° C. and the thermal decomposition point of the polymer;

(b) 20 to 60% by weight of at least one monomeric organic compound containing at least two acrylic acid and/or methacrylic acid radicals and containing from 0 to about 65% by weight of halogen atoms attached to carbon atoms having the electronic configuration $sp^2$;

(c) 0 to about 40% by weight of at least one monomeric organic compound containing an acrylic acid or methacrylic acid radical and containing from 0 to 65% by weight of halogen atoms attached to carbon atoms having the electronic configuration $sp^2$;

(d) about 1 to about 25% by weight of a photo-initiator system comprising:
   (1) 0.5 to 100% by weight of at least one aromatic ketone,
   (2) 0 to 99% by weight of at least one tertiary amine, at least one carbon atom of which, in the alpha position with regard the nitrogen atom, carries at least one hydrogen atom,
   (3) 0 to 99% by weight of an aromatic or non-aromatic alpha-dione, the sum of (1) + (2) + (3) representing 100% by weight of the photo-initiator system;

and the total content of halogen atoms attached to carbon atoms having the electronic configuration $sp^2$ representing about 3 to about 50% by weight of the total halogenated photopolymerizable composition.

By "carbon atoms possessing the electronic configuration $sp^2$" is to be understood carbon atoms which have a plane trigonal spatial configuration and which, therefore, form part of a double bond $>C = C<$, which may be either olefinic or aromatic. The halogen atoms which are carried by such carbon atoms are called here "active halogen atoms." However, there is no drawback to such a compound containing both active halogen atoms and halogen atoms carried by carbon atoms with an electronic configuration $sp^3$, provided that the conditions stated above regarding the respective content of active halogen atoms of the polymer (a) and of the total composition are satisfied.

By "glass transition temperature" is to be understood the temperature from which a polymer which is brittle and hard is converted into a rubbery or viscous polymer in which the movements of portions of the polymer chain are relatively unhindered by interactions between chains (cf. P. J. Flory, Principles of Polymer Chemistry, pub. Cornell University Press, Ithaca, 1969, p.56). This temperature, which characterizes the polymer, is determined in the present invention by the thermomechanical analysis (TMA) method described, in particular, by W. de Marteau, Chimie des Peintures, 35, (1972), 245-249.

Halogenated polymer (a)

Examples of halogenated polymers (a) used according to the present invention are mentioned, in particular, in chapters 7 and 8 of "The Chemistry and Uses of Fire Retardants" by J. W. Lyons, published by Wiley-Interscience, New York, 1970. However, of these substances, the only ones which can be used in the present invention are those which are products of polycondensation or polyaddition, the polymer chain of which is interrupted by at least one oxygen or nitrogen atom, contain from 4 to 70% by weight of active halogen atoms, have a molecular weight of about 700 to about 10,000 and have a glass transition temperature (Tg), the lower limit of which is about 20° C. and the upper limit of which is the thermal decomposition temperature of these substances.

The polymers, the chain of which is interrupted by oxygen or nitrogen atoms, comprise polymers obtained by non-radical condensation and addition reactions. Most of the starting materials used for synthesizing these polymers are commercially available at a moderate price. For this reason, the polymers derived therefrom are preferably used in the compositions according to the present invention.

As stated above, the content of active halogen atoms in the halogenated polymer (a) is from 4 to 70% by weight. Since the photopolymerization activity of the photopolymerizable composition according to the present invention increases with the halogen content of the halogenated polymer (a), it is, therefore, of interest to use halogenated polymers (a), the halogen content of which is in the upper part of the range defined above.

The molecular weight of the halogenated polymer (a) is between about 700 and about 10,000. Below a molecular weight of 700, there is less choice of starting materials to synthesize a polymer with a glass transition temperature higher than about 20° C. On the other hand, when the halogenated polymer (a) has a molecular weight greater than 10,000, the rheological properties are such that their application to a substrate becomes difficult. In view of the comparatively high molecular weight of the halogenated polymers (a), they have the advantage, as compared with non-polymeric halogenated compounds, of having a very low vapor pressure and of not giving rise to toxicity and pollution problems.

Regarding the glass transition temperature of the halogenated polymer (a), which extends from 20° C. up to the thermal decomposition temperature of the said polymer, we have found that when it is less than 20° C., the reactivity of the total composition, for example when used for the manufacture of printing inks, decreases considerably.

Among the halogenated polymers (a) which can be used according to the present invention, mention may be made of the polyhalophenylene ethers such as are described in French Patent Specification No. 1,384,255 and in German Offenlegungschrift No. 2,021,830; the resins obtained by the condensation of the reaction product of pentachlorophenol, acetone and hydrochloric acid with epichlorohydrin such as are described in Japanese Patent Application No. 26,311/68, the products obtained by the bromination of the polyaddition products of tolylene diisocyanate with a diol, which may or may not be halogenated, to give a brominated polyurethane; and the polycarbonates obtained by reacting pentachlorophenol, bisphenol A and phosgene, this reaction being described in Belgian Patent Specification No. 699,028. However, for various reasons, such as the accelerating activity of photopolymerization, ease of use, ready availability and the cost of raw materials, perference is given, according to the present invention, to:

(A) the halogenated polyesters obtained by the polycondensation of at least one monocarboxylic and/or polycarboxylic acid (or functional derivatives thereof, such as the anhydrides, acid chlorides, esters or the like) with at least one monohydric and/or polyhydric alcohol. In actual fact, the acid component, the alcoholic component or possibly both components, will contain active halogen atoms, so that the halogenated polyester thus obtained has the required content of active halogen atoms of 4 to 70% by weight.

(B) the halogenated polyurethanes obtained by the polyaddition of at least one mono- and/or polyisocyanate with at least one mono- and/or polyhydric alcohol. In this case, the isocyanate component, the alcohol component or possibly both components, will contain active halogen atoms, so that the halogenated polyurethane thus obtained has the required content of active halogen atoms of 4 to 70% by weight.

By halogen, there is to be understood fluorine, chlorine, bromine and iodine.

As acids containing active halogen atoms, use can be made, according to the present invention, of the following compounds:

(1) acids of the formula:

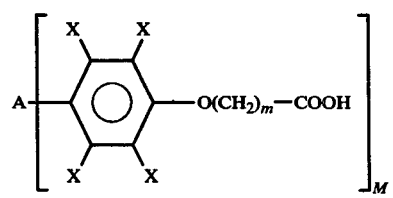

wherein X is a hydrogen or halogen atom, at least one X being a halogen atom; A is the same as X, or, when M is 2, represents a simple bond or an alkylene radical containing 1 to 5 carbon atoms; M is 1 or 2 and m is 1 to 3.

Examples of such acids include 2,4,6-trichlorophenoxy-acetic acid, 4-(pentabromophenoxy)-butyric acid, 2,3,5,6,2',3',5'6'-octachloro or octabromo-4,4'-di-(3-carboxypropyoxy)-biphenyl, 2,2-bis-[3,5-dichloro-4-(2-carboxyethoxy)phenyl]-propane and the like;

(2) acids of the formula:

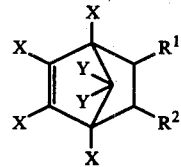

wherein X is a halogen atom, Y is a hydrogen or halogen atom, $R^1$ is $(R^3)_n COOH$ in which n is 0 or 1 to 8, $R^3$ is $-CH_2-$ or $-CH=CH-$ and $R^2$ is the same as $R^1$ or is a hydrogen atom or a methyl radical.

Examples of such acids include 1,4,5,6,7,7-hexachlorobicyclo[2,2,1]-5-heptene-2,3-dicarboxylic acid (or HET acid of the Hooker Chemical Co.), 1,4,5,6,7,7-hexachloro-bicyclo-[2,2,1]-5-heptene-2-carboxylic acid, 1,4,5,6,7,7-hexachloro-bicyclo[2,2,1]-5-heptene-2-acetic acid, 1,4,5,6,7,7-hexachloro-bicyclo[2,2,1]-5-heptene-2-pelargonic acid, 1,4,5,6,7,7-hexachloro-bicyclo[2,2,1]-5-heptene-2-acrylic acid, 1,4,5,6-tetrachloro-bicyclo[2,2,1]-5-heptene-2,3-dicarboxylic acid, 1,4,5,6,7,7-hexabromo-bicyclo[2,2,1]-5-heptene-2,3-dicarboxylic acid, 1,4,5,6,7,7-hexachloro-3-methyl-bicyclo[2,2,1]-5-heptene-2-carboxylic acid and the like;

(3) the following acids or anhydrides: 3,5-dibromosalicylic acid, tetrachlorophthalic acid (Tetrathal of Monsanto), tetrabromophthalic acid (Firemaster PH4 of Michigan), 2,3-dicarboxy-5,8-endomethylene-5,6,7,8,9,9-hexachloro-1,2,3,4,4a,5,8,8a-octahydronaphtalene anhydride (Chloran of UOP Chemical), dichloromaleic anhydride and the like.

As alcohols containing active halogen atoms, according to the present invention there may be used, for example, the following compounds:

(1) addition products of 1 to 10 moles of ethylene oxide or propylene oxide on to monocarboxylic or polycarboxylic acids containing active halogen atoms, such as those mentioned above. Particular mention is made of the addition products of ethylene oxide or propylene oxide on to the Diels-Alder cyclo-addition acids of hexachlorocyclopentadiene, such as are described in U.S. Pat. No. 3,278,580.

(2) halogenated alcohols of the general formula:

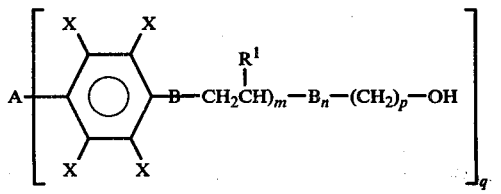

wherein X is a hydrogen, chlorine or bromine atom, at least one X being a halogen atom; A is the same as X or, when q is 1, A is

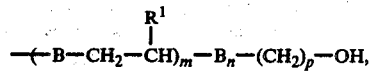

whereas, when q is 2, A is an alkylene group containing 1 to 5 carbon atoms or a simple bond, B is an oxygen atom or an NH group; m is 0 to 10; $R^1$ is a hydrogen atom, a hydroxyl group or a methyl radical; n is 0 when m is not 0 and n is 1 when m is 0; p is 0 to 5, with the proviso that when m is 0, p is $\geq 2$ and when p is 0, m is $\geq 1$, and q is 1 or 2.

Examples of such alcohols include 2-(4-chlorophenoxy)-ethan-1-ol, 4-(2,4,6-trichlorophenoxy)-butan-1-ol, 3-(pentachlorophenoxy)-propan-1-ol, 2-[2-(2-(2,4,6-tribromophenoxy)-ethoxy)-ethoxy]-ethan-1-ol, 3-(pentachlorophenoxy)-propane-1,2-diol, 2,3,5,6,2',3',5',6'-octachloro-4,4'-di-(2-(2-hydroxyethoxy)-ethoxy)-biphenyl (Decadiol 02A of Caffaro), 2,3,5,6,2',3',5',6'-octachloro-4,4'-di-2-hydroxyethylamino)-biphenyl (Decadiol 111 of Caffaro), 2,2-bis-[3,5-dichloro-4-(2-hydoxyethoxy)-phenyl]-propane, 2,2-bis-[3,5-dibromo-4-(2,3-dihydroxypropoxy)-phenyl]-propane, 1,4-bis-(2-hydroxypropoxy)-2,3,5,6-tetrachlorobenzene and the like;

(3) 1,2,3,5-tetrachlorobenzene-4,6-dimethanol;

(4) alcohols of the formula:

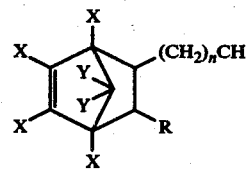

wherein X is a chlorine or bromine atom, Y is a hydrogen, chlorine or bromine atom, R is a hydrogen atom or a methyl radical or a $(CH_2)_nOH$ radical and n is 1 to 4.

Examples of such alcohols include 1,4,5,6,7,7-hexachloro-2,3-bis-(hydroxymethyl)-bicyclo-[2,2,1]-5-heptene (Diol HET marketed by Hooker Chemical Co.), 2-(3-hydroxybutyl)-1,4,5,6,7,7-hexachlorobicyclo-[2,2,1]-5-heptene and the like.

(5) alcohols in the form of epoxy compounds of the formula:

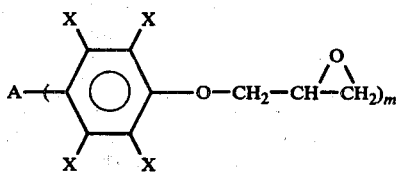

wherein X is a hydrogen or halogen atom, at least one X being a halogen atom and m is 1 or 2, m being 1 when A is the same as X, and m being 2 when A is a simple bond or an alkylene radical containing 1 to 5 carbon atoms.

Examples of such epoxy compounds include the bisglycidyl ether of 2,2-bis-(3,5-dichloro-4-hydroxyphenyl)-propane, the bisglycidyl ether of 2,3,5,6,2',3',5',6'-octachloro-4,4'-dihydroxy-biphenyl and the glycidyl ethers of pentachloro- and pentabromophenol.

When the acid component of the halogenated polyester does not contain any active halogen atoms, this acid component may be, for example:

(1) a monocarboxylic acid, such as acetic acid, monochloroacetic acid, dichloroacetic acid, trichloroacetic acid, propionic acid, butyric acid, vinylacetic acid, acrylic acid, methacrylic acid, benzoic acid, phenoxyacetic acid or the like;

(2) a dicarboxylic acid, such as glutaric acid, succinic acid, adipic acid, sebacic acid, maleic acid, fumaric acid, citraconic acid, itaconic acid, mucochloric acid, phthalic acid, isophthalic acid, terephthalic acid, tetrahydrophthalic acid or the like;

(3) a tricarboxylic acid, such as trimellitic acid or the like;

(4) a tetracarboxylic acid, such as pyromellitic acid or the like;

it being understood that, instead of the free acids, it is also possible to use their functional derivatives, such as their anhydrides, acid chlorides, esters or the like. When the acids are in the form of their acid chloride, it is not essential to use the phenols in their oxyethylated or oxypropylated form. Indeed, it is possible to react a halogenated bisphenol with an acid dichloride in the presence of a tertiary amine in accordance with the method described in Belgian Patent Specification No. 708,369.

When the alcoholic component of the halogenated polyester does not contain any active halogen atoms, this component may be, for example:

(1) a monohydric alcohol, such as methanol, ethanol, n-propanol, isopropanol, n-butanol, isobutanol, 2-ethyl-hexanol, benzyl alcohol, allyl alcohol, the diallyl ether of trimethylolpropane or the like;

(2) a dihydric alcohol, such as ethylene glycol, propylene glycol, 1,4-butane diol, 1,6-hexane diol, neopentyl glycol, hydrogenated bisphenol A, tricyclodecane-dimethanol (TCD-alcohol DM of Farbwerke Hoechst), and the like;

(3) a trihydric alcohol, such as glycerol, trimethylolethane, trimethylolpropane or the like;

(4) a tetrahydric alcohol, such as pentaerythritol or the like;

(5) a pentahydric or hexahydric alcohol or one with even more hydroxyl groups, such as dipentaerythritol, sorbitol or the like;

(6) an ether alcohol, such as the addition products of ethylene oxide and propylene oxide on to alcohols, such as those exemplified above, as well as on to phenols, such as phenol, p,p'-bis-2,2'-isopropylidene-diphenol or the like;

(7) certain alcohols can be used in the form of epoxy compounds, such as ethylene oxide, propylene, oxide, epichlorohydrin, the bis-glycidyl ether of 2,2-bis-(4-hydroxyphenyl)-propane and the like.

However, according to the present invention, use may also be made at the same time, for the preparation of the polyester, of an acid with active halogen atoms and an acid which has no active halogen atoms, as well as an alcohol with active halogen atoms and an alcohol which has no active halogen atoms, provided that the polyester thus obtained satisfies the requirements set out above; i.e. contains 4 to 70% by weight of active halogen atoms, has a molecular weight of about 700 to about 10,000 and has a glass transition temperature of between about 20° C. and the decomposition temperatue of the polyester.

The halogenated polyesters according to the present invention may be grouped into the following three categories:

(1) containing an unsaturation providing rapid polymerization;

(2) containing an unsaturation providing moderate polymerization;

(3) containing no polymerizable unsaturation.

In the first category, the unsaturation is that provided by the acrylic esters or acrylamides. In this case, the polymerization takes place at high speed and the photochemical reactivity is very high. Sometimes an acceptable immediate adhesion to a non-porous substrate is observed but, in the case of excessive irradiation (the application of a number of successive layers), this adhesion decreases and may become zero after a few days (see Example 10 and Table IV, Example 11E).

In the second category, the unsaturation is that provided by compounds containing methacrylic methacrylamide, maleic, fumaric and allyl radicals. Although they are less sensitive to an overdosage of ultraviolet irradiation, the loss of adhesion is, nevertheless, still marked (see Examples 2 and Table IV, Example 13B and 13C). Furthermore, a marked decrease in the photochemical reactivity is observed (see Example 2, Example 9B of Table III and Examples 13A, 13B and 13C of Table IV).

In the third category, there is no polymerizable unsaturation and the surprising discovery has been made that the halogenated polyesters of this category combine a high photochemical reactivity with the production of coatings, the surface of which is hard and non-scratching within very short periods of irradiation, with an excellent and immediate adhesion to smooth and impermeable substrates, such as metals, glass and the like, and an insensitivity to a possible overdosage of ultra-violet rays, which allows successive applications, without any delay, of several layers of the product on to the substrate. Therefore, the halogenated polyesters of the third category are preferably used in the present invention, it being noted that the halogenated polyesters of the first and the second categories are also of interest, provided that excessive irradiation is avoided. The saturated halogenated polyesters also offer the advantage of starting off from raw materials which are not so expensive and they can be manufactured more economically on an industrial scale than the related halogenated polyesters containing a polymerizable unsaturation, it being possible, in particular, for the latter to gel because of a premature polymerization. It will be observed that the halogenated polyesters of the third category always contain an aromatic, alicyclic or olefinic unsaturation substituted by halogen atoms, but this unsaturation cannot be polymerized by radical polymerization methods and, therefore, does not suffer from the drawbacks of the compounds containing polymerizable or copolymerizable unsaturation.

In the halogenated polyurethane which may be used according to the invention, the isocyanate component containing active halogen atoms may be:

(1) a monoisocyanate such as o-, m- and p-chlorophenyl isocyanates, 3,4- and 2,5-dichlorophenyl isocyanates, 4-bromophenyl isocyanate, 3,4-dibromophenyl isocyanate, and the like;

(2) a diisocyanate such as 1-chloro-2,4-phenylene diisocyanate, 3,3'-dichloro-4,4'-diphenyl diisocyanate, 4-bromo-m-phenylene diisocyanate, 4,6-dibromo-m-phenylene diisocyanate and the like.

When the isocyanate component does not contain any active halogen atoms this isocyanate component may be:
(1) a monoisocyanate such as phenyl isocyanate and the like;
(2) a diisocyanate such as 4,4'-diphenyl diisocyanate, 3,3'-dimethyl-4,4'-diphenyl diisocyanate, 4,4'-diphenylmethane diisocyanate, 3,3'-dimethyl-4,4'-diphenylmethane diisocyanate, 1,5-naphthalene diisocyanate, the mixture of 2,4- and 2,6- isomers of tolylene diisocyanate, 2,4-tolylene diisocyanate, m-xylylene diisocyanate, 4,4'-dicyclohexylmethane diisocyanate, hexamethylene diisocyanate, isophorone diisocyanate and the like;
(3) a triisocyanate such as 2,4,4'-triisocyanate diphenyl ether, triphenylmethane-4,4',4"-triisocyanate and the like.

In the halogenated polyurethanes which may be used according to the invention, the alcohol component containing active halogen atoms may be selected among those mentioned above for the preparation of the halogenated polyester. Likewise, the alcohol component which does not contain any active halogen atoms is selected among those mentioned above for the preparation of the halogenated polyester.

Preparation of the Halogenated Polymer

For the method of preparation of the polyhalophenylene ethers, reference is made to the above-mentioned French Patent Specification No. 1,384,255.

For the condensation of pentachlorophenol with acetone, hydrochloric acid and epichlorohydrin reference is made to the above-mentioned Japanese Patent Application No. 26,311/68.

The preparation of the halogenated polyurethanes is described in Kirk-Othmer, Encyclopedia of Chemical Technology, 2nd edition, vol. 21, pages 56 to 106 (see also Example 17 of the present specification).

The preparation of the halogenated polymer (a) in the form of a polyester is carried out as described in Kirk-Othmer, loc. cit., vol. 16, pages 159 to 189.

When the halogenated polymer (a) is a polyester prepared from halogenated acid anhydrides and epoxy compounds in the presence of a tertiary amine as catalyst, the method of preparation used may be that described by R. F. Fischer in the J. of Polymer Science, 64, 155–172, (1960).

Moreover, the following procedure may be used in order to prepare the halogenated polyesters:

In a conventional polycondensation apparatus equipped with an agitator, an inert gas inlet (nitrogen for example), a thermometer, an azeotropic distillation device (for example that of Dean-Stark), there are first placed the acids and the alcohols which are to be polyesterified, and possibly a catalyst. The operating conditions will vary, depending upon whether the polyesterification is carried out with or without the use of a solvent, on the one hand, and depending upon whether the acid component is used in the form of the free carboxylic acid or of an alkyl ester, acid chloride or anhydride, or, whether the alcohol is used in the form of an epoxy compound, on the other hand.

Thus, when the acid is used in the free state or in the form of an anhydride, the polyesterification is carried out at a temperature of from 60° to 250° C., at the beginning of the reaction at atmospheric pressure and towards the end of the reaction under reduced pressure, for a period of from 0.5 to 100 hours; if the polyesterification has been carried out without the use of a solvent, the hot resinous product obtained is cast into drums or is mixed directly, whilst still hot, with the other components (b), (c) and/or (d) of the photopolymerizable composition according to the present invention; if the polyesterification has been carried out in the presence of an azeotropic solvent, such as benzene or toluene, in the absence or in the presence of an esterification catalyst, such as sulfuric acid or p-toluene-sulfonic acid, it is necessary, at the end of the reaction, to remove the solvent, the catalyst and the unreacted reagents by distillation under reduced pressure, by washing or by neutralization.

When the acid and/or the alcohol is used in the form of a monomeric ester, it is also possible to omit the use of a solvent, in the manner described above, or to carry out the process in the presence of a catalyst and possibly of a solvent, it being possible for the latter to be an inert organic solvent, such as benzene, or an excess of one of the reagents used, for example the alcohol to be polyesterified. Examples of catalysts which can be used include potassium carbonate and alkyl titanates, for example the Tyzor catalysts of E. I. du Pont de Nemours & Co. The operating conditions (temperature, pressure and duration) are more or less the same as for the polyesterification with the acid in the form of the free acid or of its anhydride.

For the polyesterification starting off from an acid chloride, the polymerization reaction may be carried out in a single phase in the presence of an inert organic solvent and of a tertiary amine, such as triethylamine, pyridine or the like, or in two phases by using the known techniques of interfacial polyesterification. The reaction is generally carried out at a temperature equal to or less than ambient temperature, at atmospheric pressure and for a duration which may range from the time necessary for the addition of the reagents to several hours. The hydrochloride of the tertiary amine formed is then separated off by filtration, the solvent is driven off by distillation and the polyester is recovered in the form of the residue from this distillation.

When the alcohol is used in the form of an epoxy compound, it is possible to operate in the presence or in the absence of a solvent and in the presence of a tertiary amine as catalyst, such as triethylamine, pyridine or the like; the polyesterification mixture is heated to a temperature of 60° to 250° C. at atmospheric pressure or at a pressure higher than atmospheric pressure if the epoxy compound is gaseous at the reaction temperature; in the latter case, an autoclave is used as the reactor. The duration of the reaction may vary from 0.5 to 100 hours, depending upon the nature of the reagents used.

Examples of the polymer (a) according to the present invention are given in the following Table I, which also shows the $T_g$ value, the content of active halogen, the molecular weight and the nature of the hetero-atom in the polymer chain:

TABLE I

Examples of polymer (a)

| Composition No. | Constituent(s) with active halogen atoms (mole percent) | Other constituents (mole percent) | Tg* °C | active halogen % | M.W.** | heteroatom |
|---|---|---|---|---|---|---|
| 1 | 1,4,5,6,7,7-hexa-chloro-bicyclo-[2,2,1]-hept-5-ene-2,3-dicarboxylic acid (HET acid) (27.6) | phthalic anhydride(21.9)+ diethylene glycol (20.0)+ ethylene glycol (30.5) | 52 | 12 | 3100 | 0 |
| 2 | HET acid (27.6) | maleic anhydride (21.9)+ diethylene glycol (6.4)+ ethylene glycol (44.1) | 53 | 11 | 1900 | 0 |
| 3A | HET acid (27.6) | phthalic anhydride(21.6)+ | 20 | 11.7 | 770 | 0 |
| B | | diethylene glycol (20.0)+ | 26 | 11.7 | 1200 | 0 |
| C | | ethylene glycol (30.8) | 42 | 11.7 | 1900 | 0 |
| 4 | HET acid (14.0) | phthalic anhydride(35.3)+ diethylene glycol (20.1)+ ethylene glycol (30.6) | 32 | 7 | 1900 | 0 |
| 5 | tetrachloro-phthalic anhydride (11.2) | phthalic anhydride(36.7)+ benzoic acid (0.98)+ ethylene glycol (51.3) | 36 | 14 | 1700 | 0 |
| 6 | HET acid (50) + 2,3,5,6,2',3',5',6'-octa-chloro-4,4'di-(2-(2-hydroxyethoxy)-ethoxy)-biphenyl or D02A (50). | — | 70 | 39 | 3000 | 0 |
| 7 | tetrabromo-phthalic anhydride (12.2) | phthalic anhydride(35.7)+ benzoic acid (1.0)+ ethylene glycol (51.1) | 37 | 29 | 4000 | 0 |
| 8 | D02A (50) | tolylene-diisocyanate (50) | 48 | 36 | 4000 | N,O |
| 9 | HET acid (46.15) | dipentaerythritol(7.70) + 2-ethyl-hexanol(46.15) | 15***** | 13.5 | 3152*** | 0 |
| 10 | 1,4,5,6,7,7-hexa-chloro-bicyclo[2,2,1]-hept-5-ene-2-carboxylic acid (85.7) | dipentaerythritol(14.3) | 78 | 19 | 2216*** | 0 |
| 11 | tetrachloro-phthalic anhydride (5.49) | phthalic anhydride(42.3) + benzoic acid(0.98); ethylene glycol(51.2) | 37 | 7 | 7700 | 0 |

*determined by thermomechanical analysis (TMA)
**molecular weight determined by gel permeation chromatography (GPC)
***theoretical molecular weight (calculated)
****If D02A is replaced by the corresponding octabromo compound and if the HET acid is replaced by 2,3,5,6,2',3',5',6'-octabromo-4,4'-di(3-carboxypropoxy)-biphenyl, the total active bromine content is about 68%.
*****Comparative.

The halogenated polymer (a) is an essential constituent of the composition according to the present invention. Indeed, we have, surprisingly, discovered that this not only considerably improves the reactivity of the acrylic compounds (b) and (c) of the composition towards visible or ultra-violet irradiation but that it increases the adhesion of the composition to such a point that, for example in the field of inks, after the application of a first layer of the composition on to a smooth surface and after its polymerization by actinic light, a second layer of the composition may directly be applied without in any way harming the adhesion of the first layer to the substrate. Thus, to summarize, in this way it is possible to remedy the defects of the processes known at present, i.e. having to wait for a certain period of time to enable the first layer to adhere sufficiently to the substrate or to accelerate the increase in the adhesion by an intermediate heating between each layer applied. Finally, for all the cases where it is not necessary to apply more than one layer to the substrate, after the irradiation, the coated article may be used directly without the layer becoming detached from the substrate.

With regard to the use of the compositions according to the invention in screen printing inks and varnishes, more particularly for the manufacture of printed circuits, the halogenated polymer (a) not only brings about a good adhesion to copper or to paper impregnated with resin, but also it considerably increases the reactivity towards UV irradiation, offers a good resistance to etching baths, and to molten tin and other manipulations which the printed circuits undergo in the course of their manufacture.

Monomeric Organic Compound (b)

As stated above, the photopolymerizable compositions according to the present invention contain from 20 to 60% by weight of a monomeric organic compound containing at least 2 radicals of acrylic acid and/or methacrylic acid and from 0 to about 65% by weight of halogen atoms attached to carbon atoms possessing the electronic configuration $sp^2$.

The compound (b) is a condensation product of (1) at least one polyalcohol containing 2 to 6 hydroxyl groups with (2) at least one alpha, beta-ethylenically-unsaturated monocarboxylic acid containing 3 or 4 carbon atoms and possibly with (3) at least one mono- to tetracarboxylic organic acid, it being possible for the polyalcohol (1) and/or the mono- to tetracarboxylic organic acid (3) to contain or not to contain active halogen atoms, in such a way that the compound (b) contains from 0 to approximately 65% by weight of them.

The polyalcohol (1) may be a dihydric compound, such as ethylene glycol, propylene glycol, 1,4-butane diol, 1,6-hexane diol, neopentyl glycol or the like, a trihydric compound, such as glycerol, trimethyloleth-ane, trimethylolpropane or the like, a tetrahydric compound, such as pentaerythritol or the like, or a pentahy-dric or hexahydric compound, such as dipentaery-thritol, sorbitol or the like.

When the polyalcohol (1) is halogenated, it may be selected from the alcohols containing active halogen atoms already mentioned for the preparation of the halogenated polyester.

The alpha, beta-ethylenically-unsaturated monocarboxylic acid containing 3 or 4 carbon atoms (2) is methacrylic acid or, preferably, acrylic acid.

The mono- to tetracarboxylic organic acid (3) may be a monocarboxylic acid, such as acetic acid, propionic acid or the like, a dicarboxylic acid, such as succinic acid, adipic acid, phthalic acid or the like, a tricarboxylic acid, such as trimellitic acid or the like, or a tetracarboxylic acid, such as pyromellitic acid or the like; a more complete list of these acids has already been given above for the synthesis of the halogenated polyester.

When this mono- to tetracarboxylic organic acid (3) contains active halogen atoms, it can also be selected among those already mentioned above for the preparation of the halogenated polyester.

Examples of monomeric compounds (b) containing at least one polyalcohol (1) and at least one alpha, beta-ethylenically-unsaturated mono-carboxylic acid (2) include: diacrylates and dimethacrylates of ethylene glycol, of diethylene, triethylene, tetraethylene or polyethylene glycols, of dipropylene and polypropylene glycols, of butanediol, hexanediol or neopentylglycol or of oxyethylated or oxypropylated bisphenol A; the triacrylates and trimethacrylates of trimethylolethane, trimethylolpropane, glycerol and the like and the tetraacrylates and tetramethacrylates of pentaerythritol. It is also possible to use the acrylates and methacrylates of the oxyethylation or oxypropylation products of these polyalcohols. Mention may also be made of the diacrylates, triacrylates and tetraacrylates and methacrylates of bis-glycidyl ethers of bisphenol A or F, and the like. As examples of a polymerizable halogenated ester, mention may be made of the diacrylate and dimethacrylate of 2,3,5,6,2',3',5',6'-octachloro-4,4'-di-(2-(2-hydroxyethoxy)ethoxy)-biphenyl (Decadiol 02A of Caffaro).

As examples of monomeric compounds (b) which contain, at the same time, at least one polyalcohol (1), at least one alpha, beta-ethylenically-unsaturated mono-carboxylic acid (2) and at least one mono- to tetracarboxylic organic acid (3) mention may be made of the condensation product of 1 mole of adipic acid, 2 moles of pentaerythritol and 6 moles of acrylic acid or methacrylic acid; the condensation product of 1 mole of a $C_{36}$ dimeric acid (Empol 1010 of Unilever-Emery), 2 moles of pentaerythritol and 6 moles of acrylic acid or methacrylic acid, and the like. As an example of a mixed ester of this type containing active halogen atoms, mention may be made of the condensation product of 1 mole of tetrachlorophthalic anhydride, 2 moles of diethylene glycol and 2 moles of acrylic acid or methacrylic acid and the like.

The monomeric organic compound (b) preferably has a low vapor pressure so that, if the composition according to the present invention is used as a binder in inks, paints or varnishes, it does not cause any trouble (odour, intoxication) for the user.

The essential role of the monomeric organic compound (b) is to form, after an irradiation with visible or ultraviolet light, a cross-linked network which will support the non-polymerizable components and the non-polymerized residues of the composition according to the present invention, so as to obtain a dry, hard film. At the same time, it ensures the reciprocal compatibility of the various constituents of the composition and it also regulates its viscosity.

When the content of compound (b) exceeds 60% by weight, the speed of drying of the film is acceptable but this hardened film becomes too stiff and its adhesion to non-porous substrates decreases considerably. Furthermore, the compositions according to the present invention which contain more than 60% by weight of the compound (b) do not adhere sufficiently to a metal substrate directly after drying and the film thus obtained is not capable of immediately accepting a second printing. On the other hand, when the content of compound (b) is less than 20% by weight of the total composition according to the present invention, the speed of polymerization becomes insufficient, resulting in a low rate of production of articles coated with the composition according to the present invention used in the form of coatings.

Monomeric Organic Compound (c)

The compounds (c) are monoacrylates or monomethacrylates of monohydric or polyhydric aliphatic, alicyclic or aromatic alcohols. They are compatible with the compounds (a) and (b) of the composition according to the present invention and form true solutions with them. However, their use is not essential; they can be used in amounts of from 0 to 40% by weight, referred to the total composition.

The compounds (c) are, therefore, added in certain cases as co-reactive diluents for the purpose of modifying the rheology of the total composition, as adhesion promotors, as co-reactive internal plasticizers, to increase the reactivity, for example when using the compounds (c) containing active halogen atoms & as agents to modify the surface properties of the hardened film, for example by the use of silyl or silane compounds (c).

With more particular regard to the monoacrylates or monomethacrylates of monohydric alcohols, from the point of view of reactivity, any of them may be used, regardless of the nature of the alkyl radical. However, with regard to the practical utilization of the compound (c), any esters which could give rise to problems of odor and/or toxicity and particularly because of too high a vapor pressure under the conditions of use or because of their solubility in water, are preferably not employed. Thus, acrylic acid, methacrylic acid, $C_1$ to $C_6$-alkyl acrylates and furfuryl acrylate are not used for this reason. Use is preferably made of acrylates or methacrylates with a low vapor pressure, such as the 2-ethylhexyl, lauryl, stearyl, benzyl, 2-phenoxyethyl, 2-[4-(n-nonyl)phenoxy]-ethyl, 2-phenoxy-(polyethoxy)-ethyl, diethylene glycol monoethyl ether and the like acrylates or methacrylates.

With more particular regard to the monoacrylates or monomethacrylates of polyhydric alcohols, practically all of them satisfy the requirement of a very low vapor pressure at the temperature of use of the compositions according to the present invention. As polyhydric alcohols, use may be made of all those which have already been mentioned above for the synthesis of the compound (a) and of the compound (b). By way of example, mention may be made of the monoacrylates and monomethacrylates of diols such as 1,4-butanediol and 1,6-hexanediol, of triols, such as glycerol, trimethylolpropane and the like, as well as of all of their oxyethylation and oxypropylation products. Since at least one free hydroxyl group still remains in the molecule of the monoacrylate or monomethacrylate of a polyhydric alcohol, these excess hydroxyl groups can be reacted with other monofunctional reactive compounds and, in this way, the molecular weight can be increased, examples of these being monoisocyanates, such as phenyl isocyanate and the like, an acid anhydride such as phthalic anhydride, maleic anhydride and the like, and acid chlorides, such as acetyl chloride and the like. As a special example, mention may be made of the esterification product of one molecule of 2-hydroxyethyl acrylate with one molecule of phthalic anhydride or the like.

As stated above, the compound (c) may also contain active halogen atoms so that the total composition according to the present invention contains a sufficient number of active halogen atoms to satisfy the range mentioned above of 3 to 50% by weight. The compounds (c) with active halogen atoms which can be used include those obtained by the esterification of one molecule of acrylic or methacrylic acid with one molecule of a mono- or polyhydric compound (or the mono- or polyepoxide equivalent thereof) containing active halogen atoms, such as those already mentioned for the preparation of compounds (a) and (b). Specific examples include the monoacrylates and monomethacrylates of 3-(pentachlorophenoxy)-propan-1-ol, of 3-(2,4,6-tribromophenoxy)-propan-1,2-diol, of 2-(3-hydroxybutyl)-1,4,5,6,7,7-hexachloro-bicyclo[2,2,1]-5-heptane, the addition products of 2-hydroxyethyl acrylate or methacrylate on tetrachlorophthalic anhydride or tetrabromophthalic anhydride and the like. Compounds (c) containing active halogen atoms can also be obtained by esterifying glycidyl acrylate or methacrylate with acids containing active halogen atoms, such as those already mentioned above with regard to compounds (a) and (b). Specific examples include the reaction product of glycidyl acrylate with 2,4,6-trichlorophenoxy-acetic acid, 1,4,5,6,7,7-hexachlorobicyclo[2,2,1]-5-heptene-2,3-dicarboxylic acid and the like.

In conclusion, the necessary content of active halogen atoms in the composition according to the present invention is provided by the compounds (a), (b) and (c), but it is essential for the compound (a) to contain at least 4% by weight of active halogen atoms (Examples 11B and 11F). If the total composition does not contain sufficient active halogen atoms provided by the compound (a), this deficit can be made up by using compounds (b) and/or (c) containing active halogen atoms (Example 18). However, it is possible and even advantageous for compounds (a), (b) and (c) each to provide active halogen atoms because, as stated above, there is a clear relationship between the content of active halogen atoms of the total composition according to the present invention and the speed of photopolymerization thereof by actinic light (Example 14).

Photo-Initiator System (d)

The compositions according to the present invention contain from 1 to 25% by weight of a photo-initiator system (d). This photo-initiator system makes it possible considerably to accelerate the drying under visible or ultraviolet light of coatings containing the photopolymerizable halogenated composition according to the present invention as a binder. As already stated above, the photo-initiator system (d) contains:

(1) 0.5 to 100% by weight of at least one aromatic ketone,
(2) 0 to 99.5% by weight of at least one tertiary amine, at least one carbon atom of which, in the alpha-position with regard to the nitrogen atom, carries at least one hydrogen atom,
(3) 0 to 90% by weight of at least one aromatic or non-aromatic alpha-dione, the sum of (1) + (2) + (3) representing 100% by weight of the photo-initiator system.

The aromatic ketones which can be used include acetophenone, propiophenone, 2-phenyl-acetophenone, 2-chloro-2-phenyl-acetophenone, 2,2-dichloro-2-phenyl-acetophenone, 2-butyloxy-2-phenyl-acetophenone, 2,2-dimethoxy-2-phenyl-acetophenone, 2,2-diethoxy-acetophenone, 2-methylol-2-methoxy-2-phenyl-acetophenone, 2-hydroxy-2-phenyl-acetophenone, benzophenone, 4-trichloro-methylbenzophenone, indenone, 1,3-indandione, fluorenone, xanthone, thioxanthone 2-chlorothioxanthone, anthraquinone, 2-ethylanthraquinone, 1,6-hexanediol acrylate o-benzoylbenzoate, and the like.

The photo-initiator action of these aromatic ketones is greatly improved by a tertiary amine having at least one hydrogen atom on the carbon atom next to the nitrogen, examples of such tertiary amines including trimethylamine, triethanolamine, N-methyldiethanolamine, N,N'-dimethyl-ethanolamine, dimethylstearylamine, N,N-dimethylaniline and N,N'-di-(2-hydroxyethyl)-aniline.

The photo-initiator action of the above-mentioned aromatic ketones can also be considerably improved by the addition of at least one aromatic or non-aromatic alpha-dione, examples of which include biacetyl, glyoxal, indane-1,2-dione, p-chlorophenyl-glyoxal, benzil, camphoquinone and the like.

According to the present invention, it can, in certain cases, be advantageous to associate, in the same molecule, the tertiary amine function, at least one carbon atom of which, in the alpha-position with regard to the nitrogen atom, carries at least one hydrogen atom, with the aromatic ketone function, for example, 2-isopropyloxy-2-(4-dimethyl-aminophenyl)-propiophenone, 4-dimethyl-aminobenzophenone, 4,4'-bis-dimethylaminobenzophenone, N-methylacridone, 2-diethylamino-9-fluorenone, 7-diethylamino-4-methylcoumarin and the like. Likewise, in one and the same molecule, the tertiary amine function, at least one carbon atom of which, in the alpha position with regard to the nitrogen atom, carries at least one hydrogen atom, may be associated with at least one acrylic or methacrylic radical, for example, the mono-, di- and triacrylates or methacrylates of triethanolamine, N-methyldiethanolamine, N,N'-dimethyl-ethanolamine or N,N'-di-(2-hydroxyethyl)-aniline, or the mixed esters of acrylic acid and beta-dimethylaminopropionic acid with polyols, such as 1,4-butanediol, trimethylolpropane and the like.

Preparation of the Halogenated Photopolymerizable Composition

To prepare the halogenated photopolymerizable composition according to the present invention, the above-mentioned quantities of compounds (a), (b), (c) and (d) are mixed homogeneously at ambient temperature, using a conventional mixing apparatus. However, when the speed of mutual solution is deemed to be too slow at ambient temperature, it is possible to carry out this mixing operation at a moderately elevated temperature, taking care to avoid any premature polymerization. According to the nature of the compounds present, obtaining a homogeneous photopolymerizable composition requires a mixing time which may range from several minutes to a few hours.

Uses of the Halogenated Photopolymerizable Composition

The halogenated photopolymerizable composition according to the present invention may be used advantageously as a film-forming binder for all applications where a rapid polymerization is required, either alone or mixed with other products, such as inert non-copolymerizable polymers, inert plasticizers, inert organic solvents and various adjuvants. Examples of these products which can be added are mentioned in U.S. Pat. No. 3,952,032.

As these products are used conventionally in the manufacture of inks, paints and varnishes, a detailed description thereof is not necessary, since the nature, the role and the quantities to be added are well known.

The compositions of the present invention or mixtures containing them can be used, in particular, in the manufacture of photopolymerizable transparent varnishes intended for coating a wide variety of substrates, in particular, substrates with a smooth and non-porous surface, such as metal, glass, plastics, paper impregnated with resin and the like. In this case, they are used as such or mixed with inert polymers or plasticizers. Transparent filler materials may be added in quantities of up to 40% by weight. Adjuvants, the role of which is mainly to modify the rheological behaviour and the surface appearance, may be added up to a total content of 25% by weight.

The compositions of the present invention can also be used for the manufacture of semi-transparent coatings containing higher contents of transparent filler materials of up to 75% by weight, colored coatings containing coloring materials which are transparent to part of the emission spectrum of a lamp. The transparent filler materials are to have a minimum absorption in the range from 200 to 400 nanometers. They include calcium carbonate and magnesium carbonate, which may be precipitated or micronized (calcite or aragonite etc.), barium or calcium sulfate (barytes, blanc fixe and the like), micronized hydrated potassium or magnesium silicoaluminate, micronized magnesium silicate, precipitated alumina hydrate, asbestine, talc which may be micronized or not, and the like.

The compositions of the present invention are particularly useful for the screen printing varnishes with etching resists and for the screen printing varnishes used to protect the conductors during the manufacture of printed circuits. The first resist to etching solutions because of their good adhesion to copper, the second resist to soldering operations because of both their good adhesion to copper and their high resistance to heat. In this case, use is made of compositions, to which thixotropic agents are added in order to impart the rheological properties required for silk-screen application. It is also current practice to add to these products a small quantity of a transparent coloring material, for example green or blue, so as to be able to locate more easily the places which have been treated, as well as transparent inert filler materials to improve the resistance to heat.

On adding colored or uncolored pigments to the compositions, screen printing inks are obtained suitable for decorating or marking printing circuits, glass or plastic packages and the like.

The compositions of the present invention can be used in the manufacture of relief and intaglio printing plates, for photo-reproduction, photo-resists and the like.

A particularly advantageous application of the compositions of the present invention is in the field of ultra-violet inks without solvents, i.e. which dry and harden under the action of ultra-violet rays. In this case, very thin pigmented or coloured coats of these products are applied which, because of the small thicknesses applied, allow a penetration of the ultra-violet radiation which is sufficiently deep to initiate the photopolymerization at a very high speed. The compositions of the present invention are extremely useful for the manufacture of offset, letter press and flexographic inks, as well as of those used for copperplate printing, gravure and silk screen printing, which dry under ultra-violet radiation. The ultra-violet inks according to the present invention can have the following composition:

| | |
|---|---|
| halogenated photopolymerizable composition (a+b+c+d) | 30 to 95% by weight |
| inert polymers and plasticizers | 0 to 40% by weight |
| pigments, dyestuffs and filler materials | 10 to 60% by weight |
| various additives | 1 to 10% by weight |

The inert polymers and plasticizers of the ultra-violet inks according to the present invention can be those already mentioned above, provided that they have a good compatibility with the halogenated photopolymerizable composition and with the other constituents of the ink; that there is no chemical interaction with the other constituents of the ink and that there is a low absorption in the ultra-violet spectrum. The inert polymers and plasticizers are added to adapt or modify the printing characteristics, the final appearance (gloss) and the properties of the ink films obtained.

The pigments and organic dyestuffs used can be selected from the products shown in the Colour Index, which have an as low as possible absorption of wavelengths between 200 and 500 nanometers.

The use of mineral opacifying pigments may be necessary for the manufacture of white inks, for example, for offset inks intended for printing on tinplate. Examples of opacifying pigments include the oxides of titanium, zinc, iron and chromium, the sulfides of zinc and cadmium, the phosphates of manganese and ammonium, the aluminates of cobalt and the like. It is obvious that the absorption of ultra-violet rays by these opacifying pigments is greater than with organic pigments which are transparent to ultra-violet rays and that the inks formulated from these opacifying pigments require a higher energy of irradiation (expressed in milliwatts per $cm^2$ of printed surface). In other words, in order to obtain the same rate of drying, it is necessary to increase the number of ultra-violet radiators or choose photo-initiators which have an absorption in the region of the emission spectrum of the source of ultra-violet light which is not absorbed by the pigment or the binder.

The filler materials which are transparent to ultra-violet light for the inks according to the present invention are those which have already been mentioned above in the list of adjuvants which can be added to the halogenated photopolymerizable composition according to the present invention.

The halogenated compositions according to the present invention, because of their excellent adhesion to metal substrates, are particularly useful as photopolymerizable binders for white and colored coats used as the base decorative coat on tinplate packages, as well as for paints on metal sheets and strips of different types.

For base coats intended for the decoration of tinplate, 5 to 10 g per m² of a composition can be applied which contains between 10 and 45% by weight of pigments or dyestuffs. For paints, thicknesses of 15 to 50 microns can be applied.

The hardening of layers of such a thickness requires longer irradiation times and an appropriate choice of photo-initiators adapted to the adsorption spectrum of the pigments and dyestuffs used. It is generally known that the reactivity of a photopolymerizable composition is the greater, the higher is the original viscosity. If desired, organic solvents may be added to the halogenated composition of the present invention in order to lower the viscosity of the product to the level required by the technique of application. After coating, the solvent is eliminated by known techniques and the residue is then irradiated. However, this technique, which makes it possible to use contents of 10 to 30% by weight of volatile products, i.e. lower as compared with the conventional organic solutions of paint, coatings and the like, gives nevertheless rise to pollution problems. That is why it is preferred to use compositions which are free from solvents, the low viscosity of which is obtained by appropriate choice of components (b) and (c). Furthermore, as stated above, in choosing the components (b) and (c) containing active halogen atoms, higher reactivities may be obtained.

In principle, the preparation of photopolymerizable inks, paints and varnishes according to the present invention is conventional and well known.

All sources of ultra-violet or visible light can be used for polymerizing the compounds of the present invention. However, the best results are obtained with medium pressure mercury arc lamps with an energy consumption of 80 to 200 W/cm, the emitted light of which is focused by a semi-elliptical reflector into a band of a width of a few centimeters at a distance of 7.5 cm from the lamp. It is more advantageous to pass the coated substrate in the focal plane of the lamp. It may also be advisable, especially for the purpose of accelerating the speed of passage, to place several lamps one after the other. The speed of hardening underneath a single lamp may vary between a few centimeters per second and several meters per second, according to the requirements of the application, the reactivity of the formulation, the luminous intensity emitted by the lamp and the like.

The following Examples are given for the purpose of illustrating the present invention. Examples 1 to 8 bis concern in particular the preparation of the halogenated polyesters used in the compositions of Examples 9 to 24.

EXAMPLE 1

In a 4-necked 3-liter round-bottomed flask equipped with a stirrer, a nitrogen inlet, a thermometer dipping into the mass and a Dean-Stark mwater separation column, there are placed 1288 g (3.31 moles) 1,4,5,6,7,7-hexachlorobicyclo[2,2,1]-hept-5-ene-2,3-dicarboxylic acid (HET acid), 384 g (2.59 moles) phthalic anhydride, 254 g (2.40 moles) diethylene glycol, 229 g (3.69 moles) ethylene glycol and 110 g benzene. The reaction mixture is gradually heated until the mass is liquefied (time = 0, temperature = 114° C.) and then stirring is started, whilst introducing nitrogen into the flask. After 2.5 hours, the temperature of the mass is 128° C. The quantity of water distilled off is 65 ml. The temperature is continuously increased so that the mass reaches 168° C. after heating for 20 hours. The quantity of water distilled off is then 157 ml. The acidity of the solution (alcoholic KOH) is 0.4 meqH+/g, which corresponds to a rate of conversion of 92%. The benzene is distilled off under reduced pressure (temperature of the mass: 150° C., pressure: 10 mm Hg), whilst maintaining an inert atmosphere. The flask is emptied while the polyester is still in a molten state and then the polyester is allowed to cool: it has a very pale yellow color.

Analysis
acidity: 0.42 meqH+/g
Tg (thermomechanical analysis, TMA): 52° C.
molecular weight at the top of the peak in GPC: 3100
theoretical active chlorine content: 12%.

EXAMPLES 2 to 8bis

A series of polyesters is prepared according to the general mode of operation of Example 1. The proportions of the constituents, the esterification time, the temperature, the acidity, the conversion rate and the analysis of the products obtained are shown in the following Table II:

TABLE II

| | | Examples of halogenated polyesters | | | | | Analysis | | |
|---|---|---|---|---|---|---|---|---|---|
| Ex. | Constituents (mole percent) + 10% by weight benzene | theoretical content of active halogen % | reaction time (hrs) | Temperature at end of reaction (° C) | acidity of the solution (meq.H+/g) | conversion rate[2] % | acidity (meq.H+/g) | Tg (° C) (TMA) [3] | MW[4] |
| 2 | 27.6 HET acid + 21.9 maleic anhydride + 6.4 diethylene glycol + 44.1 ethylene glycol | 11 | 24 | 150 | 0.35 | 94 | 0.39 | 53 | 1900 |
| 3 | 42.9 HET acid + 28.6 1,4-butanediol + 28.6 2-ethylhexanol | 14 | 18.75 | 150 | 0.30 | 92 | 0.28 | 11[5] | 750 |
| 4A | 27.6 HET acid + 21.6 phthalic anhydride + 20 diethylene glycol + 30.8 ethylene glycol | 11.7 | 8 | 185 | 1.56 | 71.5 | 1.75 | 20 | 770 |
| B | | 11.7 | 10.25 | 192 | 1.07 | 80.5 | 1.20 | 26 | 1200 |
| C | | 11.7 | 14.75 | 192 | 0.59 | 89.2 | 0.70 | 42 | 1900 |
| 5 | 34.3 trichloroacetic acid + 34.3 phthalic anhydride + 31.3 trimethylolpropane | 0 (25.5)[1] [5] | 12 | 185 | 1.36 | 87 | 1.50 | 43 | 2000 |
| 6 | 14.0 HET acid + 35.3 phthalic anhydride + 20.1 diethylene glycol + 30.6 ethylene glycol | 7 | 24 | 160 | 0.46 | 93 | 0.50 | 32 | 1900 |
| 7 | 11.2 tetrachlorophthalic anhydride + 36.7 phthalic anhydride + 51.3 ethylene glycol + 0.98 benzoic acid | 14 | 20 | 185 | 0.73 | 91 | 0.80 | 36 | 1700 |
| 8 | 50 HET acid + 50 2,3,5,6,2',3',5',6'-octachloro-4,4'- | 39 | 8 | 152 | 0.625 | 67 | 0.68 | 70 | 3000 |

TABLE II-continued

| | | Examples of halogenated polyesters | | | | | Analysis | | |
|---|---|---|---|---|---|---|---|---|---|
| Ex. | Constituents (mole percent) + 10% by weight benzene | theoretical content of active halogen % | reaction time (hrs) | Temperature at end of reaction (° C) | acidity of the solution (meq.H+/g) | conversion rate[2] % | acidity (meq.H+/g) | Tg (° C) (TMA) [3] | MW[4] |
| 8bis | di(2-(2-hydroxyethoxy)-ethoxy)-biphenyl (decadiol 02A of Caffaro) containing 3.7 to 4.1% alcoholic OH and 50 to 51% Cl 12.2 tetrabromophthalic anhydride + 35.7 phthalic anhydride + 51.1 ethylene glycol + 1 benzoic acid | 29 | 10 | 200 | 1.00 | 86 | 1.10 | 37 | 4000 |

[1] total theoretical chlorine content
[2] conversion of the carboxyl groups
[3] glass transition temperature, measured by thermomechanical analysis (TMA) (penetrometry)
[4] molecular weight, measured at the peak maximum in gel permeation chromatography (GPC)
[5] polyester used for comparison

EXAMPLE 9

The following varnish compositions are prepared:

| | |
|---|---|
| saturated halogenated polyester of Example 1 (composition 9A) unsaturated halogenated polyester of Example 2 (composition 9B) non-halogenated unsaturated polyester* (composition 9C) | 66.6 parts by weight |
| diethylene glycol diacrylate (DEGDA) | 28.6 parts by weight |
| benzophenone | 4.1 parts by weight |
| Michler's ketone | 0.7 parts by weight |

*polyester, the mole percent composition of which is 15.7 phthalic anhydride, 32.6 maleic anhydride and 51.7 propylene glycol. The $T_g$ (thermomechanical analysis) is 49° C and the molecular weight at the peak in GPC is 2500 (for comparison).

A viscous and transparent varnish (340 poises on Laray's viscosimeter, load 500 g) is obtained.

A 3μ coat of these varnishes is applied by means of an IGT sector printer on to de-greased strips of tinplate. The relative disappearance of the resonance band of the acrylic unsaturations is measured by an infra-red reflectometric technique, passing the strips at a speed of 1.5 m/sec. in the focal plane of a Hanovia mercury arc lamp equipped with a semi-elliptical reflector, the power of which is 80 W/cm. The conversions obtained are shown as a function of the increasing number of passages below the lamp in the following Table III:

TABLE III
Effect of the active halogen on the rate of conversion of acrylic unsaturations

| Composition | Conversion as a function of the number of passages at the 1.5 m/sec. (%) | | |
|---|---|---|---|
| | 1 passage | 2 passages | 4 passages |
| 9A (saturated polyester with active halogen | 61 | 76 | 91 |
| 9B (unsaturated polyester with active halogen | 39 | 54 | 67 |
| 9C (non-halogenated polyester) | 7 | 19 | 35 |

It can thus be seen that the presence of active halogen makes it possible to activate considerably the speed of polymerization of the monomer in which the polyester is dissolved. It can also be seen that the presence of maleic or fumaric unsaturated linkages in the halogenated polyester results in a decrease in reactivity, as compared with a saturated halogenated polyester of comparable composition.

EXAMPLE 10
(Comparative)

A halogenated polyester with acrylic unsaturations is synthesized by the following method: 858 g (3 moles) tetrachlorophthalic anhydride, 296 g (2 moles) phthalic anhydride, 636 g (6 moles) diethylene glycol and 100 g benzene are introduced in the same apparatus as that used in Example 1. The reaction mixture is heated gradually until the mass has liquefied (time: 0, temperature: 138° C.) and then heating is continued until the solution reaches an acidity of 0.63 meq.H+/g (time: 28 hours, temperature: 190° C., volume of water distilled off: 80 ml). This corresponds to a conversion of 89%.

The mass is allowed to cool to 90° C. and then there are added (in this order) 1400 g benzene, 3.5 g cuprous oxide (stabilizer), 90 g p-toluene-sulfonic acid and 180 g (2.5 moles) acrylic acid. The esterification is started once more (time: 0, temperature: 82° C.) until the solution reaches an acidity of 0.44 meq.H+/g (time: 6 hours, temperature: 80° C., volume of water distilled off: 45 ml). The esterification solution is allowed to cool to 30° C. and is then washed twice with 1000 ml of a 20% aqueous sodium chloride solution, whereafter 0.5 g hydroquinone monomethyl ether are added. The solvent is then distilled off, together with the residue of acrylic acid, under reduced pressure (temperature of the mass: 75° C., pressure: 15 mmHg). The polyester is removed from the flask in a molten state and then allowed to cool. The polyester has a very pale colour.

Analysis:
acidity: 0.25 meq.H+/g
Tg (TMA): 15° C.
molecular weight: 1500
theoretical content of active chlorine: 22%.

EXAMPLES 11 to 15

A varnish is prepared by mixing a binder consisting of a polyester and a monomer with a photo-initiator system. The varnish thus obtained is converted into a white ink by grinding it in the presence of titanium dioxide, using an "Automatic Muller" plate mill (Etablissements Braive of Liège (Belgium)). The total composition is then as follows:

| | | |
|---|---|---|
| binder | 47 | parts |
| benzophenone | 2.5 | parts |
| benzil | 2.5 | parts |
| Michler's ketone | 1 | part |
| triethanolamine | 2 | parts |

-continued

| titanium dioxide | 45 | parts |
|---|---|---|

The inks which contain the different polyesters with active halogen are then printed, in a layer of 1μ thickness using an IGT sector printing apparatus, on to strips of oiled electrolytic tinplate.

The reactivity of the inks is determined by passing the strips at increasing speeds underneath a medium-pressure mercury vapor lamp (Hanovia) of 80 W/cm until the film withstands a rotary movement of the thumb under a heavy pressure (finger fixing test). This test is intended to simulate the effect of rubbing which is produced when the printed plates are stacked upon discharge from the printing machine.

To simulate the effect of the printing of a second layer of ink or varnish on top of a first layer of ink which has dried, an "X" is traced in the dry ink film, adhesive tape is applied to it and the tape is then stripped off with a single snatch. The area of the film of ink which has been stripped off as compared with the surface which was initially in contact with the adhesive tape is assessed (adhesion test on bare metal).

The results obtained with the inks made from the polyesters prepared in Examples 1 to 8bis and 10 are shown in the following Table IV, which also includes certain compositions not according to the present invention. These products are included for comparison in order better to illustrate the specific advantages of the present invention. Thus, in Examples 11B and 11F, the action of a non-halogenated saturated polyester is compared with that of a polyester 11A according to the present invention. Likewise, in Examples 11C and 11D, the action of the polyester 11A is compared with that of an acrylyl fatty urethane and an acrylyl fatty polyester, respectively, which are used in offset inks for printing paper or cardboard.

TABLE IV.

Properties of inks obtained from the elongated polyesters of the invention as well as from some of the reference polyesters.

A. Composition of binder (concentration in % of the constituents is indicated between brackets (a) + (b) + (c))

| Ex. | Type | Polyester (a) Reference | Tg (TMA) | wt. % of binder | Compounds (b) and (c) nature + wt % of binder |
|---|---|---|---|---|---|
| 11A | saturated chlorinated | Example 1 (3) | 52 | (70) | DEGDA (30) |
| B | saturated non-halogenated | (3)(4)(10) | 56 | (70) | " |
| C | urethane acrylate non halogenated | (5)(10) | — | (100) | " |
| D | acrylate non halogenated | (6)(10) | — | (100) | " |
| E | acrylate chlorinated | Example 10(10) | 15 | (70) | " |
| F | saturated non-halogenated | (3)(4)(10) | 56 | (20) | Bu$_2$—HET (50) + DEGDA (30) |
| 12A | saturated chlorinated | Example 3(3)(10) | 11 | (70) | DEGDA (30) |
| B | " | Example 4A | 20 | (70) | " |
| C | " | Example 4B | 26 | (70) | " |
| D | " | Example 4C | 42 | (70) | " |
| 13A | unsaturated (maleic) chlorinated | Example 2 | 53 | (70) | BA (30) |
| B | " | Example 2 | 53 | (70) | DEGDA (30) |
| C | " | Example 2 | 53 | (70) | DEGDA (10) + BA (20) |
| 14A | saturated with non-active chlorine | Example 5(3)(10) | 43 | (70) | DEGDA (30) |
| B | saturated chlorinated | Example 6(3) | 32 | (70) | " |
| C | " | Example 7(3) | 36 | (70) | " |
| D | " | Example 8(3) | 70 | (70) | " |
| 15 | saturated brominated | Example 8bis (3) | 37 | (70) | " |

B. Properties of obtained inks

| Ex. | concentration of active halogen in binder | reactivity[1] (m/s) | Adhesion[2] (%) 1 passage at 1.7 m/s | | | 2 passages at 1.7 m/s | | | 3 passages at 1.7 m/s | | | 10' at 170°C |
|---|---|---|---|---|---|---|---|---|---|---|---|---|
| | | | Imm.[9] | 10' | 24 h. | Imm.[9] | 10' | 24 h. | Imm.[9] | 10' | 24 h. | |
| 11A | 8.4 | 2.5 | 100 | 100 | 100 | 100 | 100 | 100 | 100 | 100 | 100 | 100 |
| B | 0 | 0.05 | nh[8] | nh | nh | nh | nh | nh | nh | nh | 20 | 100 |
| C | 0 | 3.0 | 5 | 10 | 5 | 0 | 5 | 5 | 0 | 0 | 0 | 20 |
| D | 0 | 3.0 | 0 | 5 | 10 | 0 | 0 | 5 | 0 | 0 | 0 | 10 |
| E | 16 | 3.0 | 20 | 50 | 50 | 10 | 20 | 20 | 5 | 10 | 20 | 80 |
| F | 7.2 | 0.05 | nh | nh | nh | nh | nh | nh | nh | 5 | 10 | 100 |
| 12A | 9.8 | 0.05 | nh | nh | nh | nh | nh | 20 | 10 | 50 | 100 | |
| B | 8.2 | 0.5 | nh | nh | nh | 100 | 100 | 100 | 100 | 100 | 100 | 100 |
| C | 8.2 | 1.0 | 100 | 100 | 100 | 100 | 100 | 100 | 100 | 100 | 100 | 100 |
| D | 8.2 | 2.5 | 100 | 100 | 100 | 100 | 100 | 100 | 100 | 100 | 100 | 100 |
| 13A | 7.7 | 0.25 | nh | nh | nh | nh | nh | nh | 20 | 20 | 50 | 100 |
| B | 7.7 | 1.5 | 20 | 80 | 80 | 10 | 50 | 50 | 10 | 50 | 20 | 50 |
| C | 7.7 | 0.75 | nh | nh | nh | 80 | 100 | 100 | 50 | 80 | 50 | 80 |

TABLE IV.-continued

| 14A | 0(18)[7] | 0.05 | nh | nh | nh | nh | nh | nh | 5 | 10 | 10 | 100 |
|---|---|---|---|---|---|---|---|---|---|---|---|---|
| B | 4.9 | 1.5 | 100 | 100 | 100 | 100 | 100 | 100 | 100 | 100 | 100 | 100 |
| C | 9.8 | 2.5 | 100 | 100 | 100 | 100 | 100 | 100 | 100 | 100 | 100 | 100 |
| D | 27.3 | 3.5 | 100 | 100 | 100 | 100 | 100 | 100 | 100 | 100 | 100 | 100 |
| 15 | 20.3 | 2.5 | 100 | 100 | 100 | 100 | 100 | 100 | 100 | 100 | 100 | 100 |

[1] Hanovia lamp of 80 W/cm.
[2] Two Hanovia lamps of 80 W/cm.
[3] By saturated is to be understood: does not contain polymerizable unsaturation.
[4] Composition of polyester (in mole percent): 40.9 terephthalic acid + 4.9 trimellitic anhydride + 11.7 ethylene glycol + 2.2 1,6-hexanediol + 40.3 neopentyl glycol; Tg (TMA) 56° C; MW (GPC) 2500.
[5] Example 2A of Belgian Patent Specification No. 831.185.
[6] Example 8 of U.S. Patent Specification No. 3,952,032.
[7] theoretical total chlorine (between brackets).
[8] nh = surface is not hard.
[9] Imm = immediate adherence.
[10] for comparison
DEGDA = diethylene glycol diacrylate
BA = benzyl acrylate
Bu$_2$—HET = dibutyl 1,4,5,6,7,7-hexachlorobicyclo[2,2,1]-hept-5-ene-2,3-dicarboxylate.

EXAMPLES 11A to 11E

It can be seen that only composition 11A makes it possible to obtain the desired combination of reactivity and adhesion. In fact, the ink containing the saturated polyester (11B) is adhesive but not very reactive, whilst the inks containing a polyester-urethane acrylate (11C), a polyester acrylate (11D) and a chlorinated acrylate (11E) are reactive but very little adhesive, even after one hour. The adhesion in Example 11A does not decrease: neither after an overdosage of ultra-violet irradiation nor after storage for 24 hours nor after thermal treatment in an oven. Most of the inks show an improvement of adhesion after a thermal treatment; however, this treatment constitutes a technical and economic handicap.

EXAMPLE 11F

In this Example, it can also be seen that the halogen has to be carried by the polyester. An addition of 50% by weight of the dibutyl ester of the HET acid, which has a high content of active chlorine, does not make it possible to obtain a good reactivity; the adhesion is acceptable.

EXAMPLE 12

This Example shows the importance of the Tg of the polyester. It is found that the reactivity increases with an increase in the Tg. With a Tg of 20° C., the reactivity approaches the acceptable limit. A decrease towards 10° C. (Example 12A) shows that the reactivity, as measured by the finger fixing test, is insufficient for use as a white ink.

EXAMPLE 13

When Examples 11A and 13B are compared from the point of view of immediate adhesion, it can be seen that the presence of maleic unsaturations in the chain of the polyester has an unfavorable influence. However, the adhesion improves after one hour. By replacing the DEGDA by BA (13A), the immediate adhesion becomes very good but the reactivity decreases. The latter improves in a mixed formula (13C) but without making it possible to obtain the optimum properties.

It can be seen from these Examples that the presence of a monoacrylate makes it possible to improve the adhesion but to the detriment of the reactivity. It can also be seen that the halogenated maleic polyesters may be suitable for certain uses, for example, when immediate adhesion is not necessary; in the best cases, the reactivity nevertheless remains lower than that of the halogenated saturated polyesters. Furthermore, the adhesion decreases as a result of an overdosage of ultra-violet irradiation, as a result of thermal treatment in an oven and by storage for 24 hours.

EXAMPLE 14

This Example shows the necessity of having a sufficient concentration of active halogen. Indeed, the polyester based on trichloroacetic acid does not make it possible to obtain a sufficient reactivity (14A) because the halogen atoms are carried by an sp$^3$ carbon atom. In fact, a halogenated derivative with this electronic configuration (sp$^3$) behaves like a non-halogenated saturated polyester (Example 11B). An increase in the content of active halogen (14B, 14C and 14D) makes it possible to improve the reactivity, without impairing the immediate adhesion, which remains excellent.

EXAMPLE 15

This Example shows that bromine atoms can be used as the active halogen atoms. Polyesters which contain active bromine atoms may, therefore, be used for the compositions of the present invention.

EXAMPLE 16

Varnishes are made, the general composition of which is as follows, in parts by weight:

| | |
|---|---|
| A parts of polyester of Example 1 (70p) + DEGDA (30p) | 91 parts |
| B parts of acrylate polyester* | |
| benzophenone | 8 parts |
| Michler's ketone | 1 part |

*Acrylate polyester of Example 8 of U.S. Pat. Specification No. 3,952,032.

The ratio A/B is varied. The varnishes obtained are then ground in an "Automatic Muller" with titanium dioxide, using a ratio of 11 parts of varnish to 9 parts of titanium dioxide. The reactivity is determined (with a Hanovia mercury vapor lamp of 80 W/cm) as well as the adhesion on to strips of oiled electrolytic tinplate of a 1μ coat applied by means of an IGT sector printer (Table V).

TABLE V
Effect of the concentration of active halogenated polyester on the reactivity and adhesion

| Polyester of Example 1 + DEGDA (70:30) | Acrylate polyester | reactivity in number of passages at | adhesion (%) | |
|---|---|---|---|---|
| A parts by weight | B parts by weight | 1.7 m/sec. (finger fixing | Immediate | After 1 h. |
| 100 | 0 | 3 | 100 | 100 |
| 75 | 25 | 3 | 100 | 100 |

TABLE V-continued
Effect of the concentration of active halogenated polyester on the reactivity and adhesion

| Polyester of Example 1 + DEGDA (70:30) A parts by weight | Acrylate polyester B parts by weight | reactivity in number of passages at 1.7 m/sec. (finger fixing | adhesion (%) Immediate | After 1 h. |
|---|---|---|---|---|
| 50 | 50 | 2–3 | 90 | 100 |
| 25 | 75 | 2 | 50 | 100 |
| 10 | 90 | 2 | 20 | 80 |
| 0 | 100 | 2 | 5 | 5 |

It can be seen that the gradual replacement of the polyester of Example 1 by the acrylate polyester causes a reduction in the adhesion, whilst the reactivity is only slightly modified. At intermediate levels, a sufficient adhesion is only reached after a period of 1 hour.

EXAMPLE 17

586 g 2,3,5,6,2′,3′,5′,6′-octachloro-4,4′-di-(2-(2-hydroxyethoxy)ethoxy)-diphenyl containing from 3.7 to 4.1% of alcoholic hydroxyl groups and from 50 to 51% of chlorine and 200 g toluene are placed into a 4-necked 1-liter flask equipped with an agitator, a thermometer dipping into the mass, a distillation condenser and a nitrogen feed.

The temperature is brought to 55° C. so as to dissolve the diol, nitrogen is passed into the flask and then, in the course of 5 minutes, 174 g (1 mole) of a mixture of the 2,4- and 2,6-isomers of tolylene diisocyanate, containing 1.975 meq.NCO/g are added. The temperature of the batch increases rapidly, heating being controlled by means of a bath of cold water. After 10 minutes, the temperature of the batch is 105° C., this temperature being maintained, by heating, for 30 minutes. There remain 0.200 meq.NCO/g of solution. 22 g n-propanol are added, followed by heating to 90° C. for 10 minutes. There then remains 0.018 meq.NCO/g in the solution. The toluene and excess n-propanol are distilled off under reduced pressure, whereafter the product is cast in a molten state. The polyurethane has a dark brown color.

Analysis:
Tg (TMA): 48° C.
molecular weight at the top of the in GPC: 4000
theoretical content of active chlorine: 36%.

A 75% solution of this polyurethane is prepared in 30% of DEGDA. This solution is used as a binder for white ink according to the general composition used for Examples 11 to 15. The reactivity and the immediate adhesion are determined using the mode of operation of Examples 11 to 15. The following results are obtained:
reactivity: 3.0 m/s
adhesion: 100%.

If the mixture of 2,4- and 2,6-tolylene diisocyanates used in the preparation of the polyurethane is replaced by an equivalent amount of hexamethylene diisocyanate, 4,4′-dicyclohexylmethane diisocyanate or 4,6-dibromo-m-phenylene diisocyanate and the resulting polyurethane is subjected to the test described above, the same results are obtained.

EXAMPLE 18

Varnishes are prepared, the compositions of which are as follows (in parts by weight):

| 18A | polyester of Example 6 (containing 7% of active halogen) | 20 parts |
|---|---|---|
| | 2,3,5,6,2′,3′,5′,6′-octachloro-4,4′-di-(2-(2-hydroxyethoxy)-ethoxy)-biphenyl diacrylate | 52 parts |
| | benzyl acrylate | 20 parts |
| | benzophenone | 2.5 parts |
| | benzil | 2.5 parts |
| | Michler's ketone | 1 part |
| | triethanolamine | 2 parts |

In this composition, the polyester of Example 6 introduces 1.4 parts of active halogen and the diacrylate introduces 16.7 parts of active halogen.

| 18B | polyester of Example 6 (containing 7% of active halogen | 20 parts |
|---|---|---|
| | DEGDA | 40 parts |
| | 3-(pentachlorophenoxy)-propan-1-ol acrylate | 32 parts |
| | benzophenone | 2.5 parts |
| | benzil | 2.5 parts |
| | Michler's ketone | 1 part |
| | triethanolamine | 2 parts |

In this composition, the polyester of Example 6 introduces 1.4 parts of active halogen and the monoacrylate introduces 15 parts of active halogen.

These two varnishes are spread by means of a 6μ spiral scraper on to two plates of oiled electrolytic tinplate. The reactivity of these compositions is determined by the talc test, i.e. a small amount of talc, rubbed with a finger on to the surface of the varnish and then wiped with a cloth must not leave any trace on the surface. The pencil hardness is determined and also the adhesion to adhesive tape (Table VI).

TABLE VI

| | Experiment on varnish for metal | | |
|---|---|---|---|
| Example | Reactivity (m/s) | Hardness to pencil | Immediate adhesion (%) |
| 18A | 1.2 | 3H | 100 |
| 18B | 0.90 | 2H | 100 |

Conditions: a medium-pressure mercury arc lamp (Hanovia) of 80 W/cm equipped with its semi-elliptical reflector.

It can be seen that when the polyester cannot introduce a sufficient number of active halogen atoms into the composition, it is possible to improve the reactivity whilst preserving an excellent adhesion by using monoacrylic or polyacrylic organic compounds with active halogen atoms. These compositions remain adhesive after an overdose obtained by passing them five times at 1.5 m per second under the lamp. Furthermore, the adhesion is preserved after storage for 1 week.

EXAMPLE 19

A blue ink for metal is prepared by grinding in an "Automatic Muller" the following composition (in parts by weight):

| varnish (binder + photo-initiators) of Example 11A (without TiO$_2$) | 84 parts |
|---|---|
| phthalocyanine blue (CI blue pigment 15) | 15 parts |
| polyethylene wax PA-520 (Hoechst) | 1 part |

This composition is printed in a 1μ coat, by means of an IGT sector printing machine, on to a strip of oiled electrolytic tinplate. This film of ink is dried with a Hanovia mercury arc lamp of 80 W/cm. The film is dry after a single passage at 3.5 m/sec. The immediate adhesion test by means of an adhesive tape is 100%. The adhesion does not decrease after 5 consecutive passages at the same speed under the lamp. The adhesion also does not decrease after storage for 1 week.

EXAMPLE 20

A white paint intended for tinplate is prepared having the following total composition (in parts by weight):

| polyester of Example 8 | 23 parts |
| DEGDA | 6.25 parts |
| 1,6-hexanediol diacrylate | 26 parts |
| benzophenone | 3.25 parts |
| mixed acrylate beta-dimethyl-amino-propionate ester of diethylene glycol | 6.5 parts |
| titanium dioxide | 35 parts |

To prepare this, a solution of the polyester of Example 8 in DEGDA is first ground in a three-roll mill with the titanium dioxide and then the rest of the components are added. The viscosity of the paint, measured in a Brookfield viscosimeter, is 1.2 poises (23° C.).

The white paint thus obtained is spread on to a plate of oiled electrolytic tinplate by means of a 12μ spiral scraper and then dried with a Hanovia lamp of 80 W/cm at a speed of 0.25 m/sec. The surface gloss and the covering power are excellent. The film is hardened in depth (resistance to scratching with a nail). The adhesion is 100% in the adhesive tape test. The adhesion persists despite a test with an overdose (5 passages at 0.25 m/sec.) and a period of storage of 1 week.

EXAMPLE 21

The white ink of Example 11A is printed on to plates of oiled electrolytic tinplate, followed by printing with the blue ink of Example 19, using offset presses intended for printing on metal. Designs are chosen which are rich in flat tints so that the blue ink is both in contact with the white ink and with the bare metal. The two inks are each dried by a single Hanovia mercury arc lamp equipped with a semi-elliptical reflector. The speed of movement of the plates is 1.7 m/sec. (100 m/min.). The quality of the printing is excellent. At no place has the white ink been detached at the moment of printing with the blue ink. No offset is observed (transfer of ink from the printed surface to the unprinted surface of the following plate) after termination of the stacking of the plates at the discharge end of the machine.

The inks are easy to print: the adjustment of the machine is facilitated by the ease of obtaining a water/ink balance, the inks do not stay in the inkwell and no increase in thickness on the rollers is observed. The wetting units remain clean.

The printed plates are then varnished by means of a varnishing machine using the composition of Example 18B, drying being obtained immediately thereafter with two Hanovia mercury arc lamps of 80 W/cm at a speed of 1.7 m/sec. The hardness and the adhesion are in accordance with what was observed in the laboratory. Spread & gloss are excellent.

The test was carried out again under identical conditions the next day, without cleaning the press. This shows the good stability of the inks and the varnish on the printing machines.

EXAMPLE 22

An ultra-violet varnish for silk-screen printing is prepared, the composition of which is as follows (in parts by weight):

| varnish of Example 18A | 84.5 | parts |
| Sudan Green | 0.1 | part |
| barium sulfate (incorporated by grinding on a three-roll mill) | 15 | parts |

A 15μ coat of this colored varnish is spread through a silk-screen on to a printed circuit consisting of paper impregnated with phenolic resin covered with a copper circuit. The design of the silk-screen leaves the copper zones apparent which are intended to be tinned during the subsequent operation. The varnish is dry and adhering after a single passage underneath a Hanovia mercury arc lamp of 80 W/cm at a speed of 0.5 m/sec., which corresponds to an irradiation time of 0.05 seconds. The varnished plate is then dipped in a soldering bath of molten tin at 240° C. for 10 seconds so as to tin the uncovered copper zones. The varnish preserves all its properties after this treatment.

EXAMPLE 23

An etch resist UV varnish for the manufacture of printed circuits is prepared by grinding in a three-roll mill the following composition (in parts by weight):

| polyester of Example 4A | 30 |
| tetraethylene glycol diacrylate | 14 |
| benzophenone | 4 |
| mixed acrylate beta-dimethylamino-propionate ester of 1,6-hexanediol | 20 |
| Sandorin green (SANDOZ) | 2 |
| barium sulfate | 30 |

A layer of a colored varnish is spread through an 80 mesh/cm silk-screen on to a copper film of 60μ bound to a paper impregnated with phenol resin. The design applied on the silk-screen represents a circuit used in the manufacture of a television receiver.

The varnish dries after one passage underneath a Hanover mercury arc lamp of 80 W/cm at a speed of 5 cm/sec., which corresponds to an irradiation time of 0.5 seconds. The thus varnished plate is then dipped in an etching bath, containing 40% by weight ferric chloride and kept, while stirring, at 55° C. Within 3 minutes, the copper exposed in the unvarnished regions is etched. The plate is then rinsed with tap water. The varnish is not detached at any place. The plate thus treated is then dipped in a bath of a one normal aqueous solution of sodium hydroxide, kept, while stirring, at 50° C. The film of screen printed varnish disaggregates quickly and after 3 minutes the copper which had been protected by the varnish is completely laid bare.

The results obtained do not change when the plate is irradiated 10 times at the speed of 5 cm/sec. under the same conditions as hereinbefore or when it is stored for 2 weeks at room temperature.

EXAMPLE 24

Preparation of a white silk-screen printing ink for the decoration and marking of printed circuits.

The following composition is ground in a three-roll mill (in parts by weight):

| | |
|---|---|
| polyester of Example 7 | 30 |
| 1,6-hexanediol diacrylate | 20 |
| 2-chloro-thioxanthone | 0.5 |
| mixed acrylate beta-dimethyl-aminopropionate ester of 1,6-hexandiol | 3.5 |
| silica (Syloid 621 of GRACE) | 1 |
| titanium dioxide (RN 56 of KRONOS) | 45 |

The varnished plate prepared in Example 22 is used as it is before tinning. On the varnish side of the plate, the symbols, design and texts usually mentioned on printed circuits are printed by means of a silk-screen using the above-mentioned white screen printing ink. The ink is dried by passing underneath two mercury arc lamps (IST of HILDEBRAND) at the speed of 5 cm/sec. Then tinning is carried out under the same conditions as in Example 22. After tinning, the white ink still keeps a sufficient adhesion on the varnish.

Using a silk-screen, the same design is printed with the white ink on the unvarnished side of the printed circuit and the ink is dried under the same conditions as described above. In spite of a test of overdosage (10 passes of the plate underneath the lamps at the speed of 5 cm/sec.) and a storage of the plate for 2 weeks at room temperature, the adhesion of the ink on the unvarnished side is maintained.

We claim:

1. A film-forming halogenated photopolymerizable composition, which comprises:
   (a) 20 to 70% by weight of at least one halogenated polymer, which (1) has a chain interrupted by at least one oxygen or nitrogen atom, (2) contains from 4 to 70% by weight halogen atoms attached to carbon atoms having the electronic configuration $sp^2$, (3) has an average molecular weight between about 700 and about 10,000, (4) has a glass transition temperature (Tg) between about 20° C. and the thermal decomposition point of the polymer;
   (b) 20 to 60% by weight of at least one monomeric organic compound containing at least two acrylic acid and/or methacrylic acid radicals and containing from 0 to about 65% by weight halogen atoms attached to carbon atoms having the electronic configuration $sp^2$;
   (c) 0 to about 40% by weight of at least one monomeric organic compound containing an acrylic acid or methacrylic acid radical and containing from 0 to about 65% by weight halogen atoms attached to carbon atoms having the electronic configuration $sp^2$;
   (d) about 1 to about 25% by weight of a photoinitiator system comprising
      (1) 0.5 to 100% by weight of at least one aromatic ketone,
      (2) 0 to 99.5% by weight of at least one tertiary amine, at least one carbon atom of which, in the alpha position with regard to the nitrogen atom, carries at least one hydrogen atom;
      (3) 0 to 90% by weight of an aromatic or non-aromatic alpha-dione,
      the sum of (1) + (2) + (3) representing 100% by weight of the photoinitiator system;
   and the total content of halogen atoms attached to carbon atoms having the electronic configuration $sp^2$ representing about 3 to about 50% by weight of the total halogenated photopolymerizable composition.

2. The composition according to claim 1, wherein the halogenated polymer (a) is a halogenated polyester.

3. The composition according to claim 2, wherein the halogenated polyester (a) contains no polymerizable unsaturation.

4. The composition according to claim 2, wherein the acid component of the halogenated polyester, which contains active halogen atoms, is selected from the group consisting of 1,4,5,6,7,7-hexachlorobicyclo[2,2,1-]hept-5-ene-2,3-dicarboxylic acid, 1,4,5,6,7,7-hexachlorobicyclo[2,2,1]hept-5-ene-2-carboxylic acid, tetrachlorophthalic acid, tetrabromophthalic acid, 2,3,5,6,2',3',5',6'-octabromo-4,4'-di(3-carboxypropoxy)-biphenyl.

5. The composition according to claim 2, wherein the acid component of the halogenated polyester, which does not contain active halogen atoms, is selected from the group consisting of phthalic acid, benzoic acid, adipic acid and trimellitic acid.

6. The composition according to claim 2, wherein the alcohol component of the halogenated polyester, which contains active halogen atoms is 2,3,5,6,2',3',5',6'-octachloro-4,4'-di(2-(2-hydroxyethoxy)-ethoxy)-biphenyl or 2,3,5,6,2',3',5',6'-octabromo-4,4'-di-(2-(2-hydroxyethoxy-ethoxy)-biphenyl.

7. The composition according to claim 2, wherein the alcohol component of the halogenated polyester, which does not contain active halogen atoms, is selected from the group consisting of ethylene glycol, diethylene glycol, propylene glycol, 1,4-butanediol, 1,6-hexanediol, neopentyl glycol, hydrogenated bisphenol A, oxyethylated bisphenol A, tricyclodecane-dimethanol, trimethylol-propane and dipentaerythritol.

8. The composition according to claim 1, wherein the halogenated polymer (a) is a halogenated polyurethane.

9. The composition according to claim 8, wherein the alcohol component of the halogenated polyurethane, which contains active halogen atoms is 2,3,5,6,2',3',5',6'-octachloro-4,4'-di-(2-(2-hydroxyethoxy-ethoxy)-biphenyl or 2,3,5,6,2',3',5',6'-octabromo-4,4'-di-(2(2-hydroxyethoxy-ethoxy)-biphenyl.

10. The composition according to claim 8, wherein the isocyanate component of the halogenated polyurethane, which contains active halogen atoms, is 4,6-dibromo-m-phenylene diisocyanate.

11. The composition according to claim 8, wherein the isocyanate component of the halogenated polyurethane, which does not contain active halogen atoms, is selected from the group consisting of 2,4- and 2,6-tolylene diisocyanate, hexamethylene diisocyanate and 4,4'-dicyclohexylmethane diisocyanate.

12. The composition according to claim 1, wherein the monomeric organic compound (b) is a condensation product of (1) at least one polyalcohol containing 2 to 6 hydroxyl groups with (2) at least one alpha,beta-ethylenically unsaturated monocarboxylic acid containing 3 to 4 carbon atoms with or without (3) at least one mono- to tetracarboxylic organic acid.

13. The composition according to claim 1, wherein monomeric organic compound (b) is 2,3,5,6,2',3',5',6'-octachloro-4,4'-di-(2-(2-hydroxyethoxy-ethoxy)-biphenyl diacrylate.

14. The composition according to claim 1, wherein the monomeric organic compound (b) is selected from the group consisting of diethylene glycol diacrylate, 1,6-hexanediol diacrylate, neopentyl glycol diacrylate, tetraethylene glycol diacrylate, trimethylolpropane triacrylate, oxypropylated glycerol triacrylate, pentaerythritol tetraacrylate, the condensation product of 1 mole of $C_{36}$-dimer acid, 2 moles pentaerythritol and 6 moles of acrylic acid and the condensation product of 1 mole $C_{36}$-dimer acid, 2 moles 1,6-hexanediol and 2 moles acrylic acid.

15. The composition according to claim 1, wherein the monomeric organic compound (c) is a mono- or polyhydric aliphatic, alicyclic or aromatic monoacrylate or monomethacrylate.

16. The composition according to claim 1, wherein the monomeric organic compound (c) is 3-(pentachlorophenoxy)-propan-1-ol acrylate.

17. The composition according to claim 1, wherein the monomeric organic compound (c) is benzyl acrylate or 2-(2-phenoxyethoxy)-ethyl acrylate.

18. The composition according to claim 1, wherein the aromatic ketone (1) of the photoinitiator system d) is benzophenone, Michler's ketone, 2-ethyl-anthraquinone, 2-chloro-thioxanthone or 1,6-hexanediol acrylate glycol acrylate beta-dimethylamino-propionate or 1,6-hexanediol acrylate beta-dimethylamino-propionate; and the alpha-dione (3) is benzil.

19. The composition according to claim 1, wherein only the component (a) contains halogen atoms attached to the carbon atoms having the electronic configuration $sp^2$.

20. The composition according to claim 1, wherein the component (a) and one of components (b) and (c) contain halogen atoms attached to carbon atoms having the electronic configuration $sp^2$.

21. The composition according to claim 1, wherein each of components (a), (b) and (c) contains halogen atoms attached to carbon atoms having the electronic configuration $sp^2$.

22. Process for peparation of a film-forming halogenated photopolymerizable composition according to claim 1, which comprises homogenously mixing together the components (a), (b), (c) and (d) at room temperature or at a temperature higher than room temperature but sufficiently low to avoid premature polymerization.

23. Printed inks, paints and varnishes comprising a film-forming halogenated photopolymerizable composition according to claim 1.

24. The composition according to claim 1 wherein component (a) is the esterificatin product of 3.31 moles of 1,4,5,6,7,7-hexachlorobicyclo[2,2,1]-hept-5-ene-2,3-dicarboxylic acid, 2.59 moles phthalic anhydride, 2.40 mole diethylene glycol and 3.69 moles ethylene glycol,
component (b) is diethylene glycol diacrylate and component (d) comprises benzophenone, benzil, Michler's ketone and triethanolamine.

* * * * *